US 6,528,717 B2
United States Patent
Asai et al.

(10) Patent No.: US 6,528,717 B2
(45) Date of Patent: *Mar. 4, 2003

(54) PHOTOVOLTAIC PANEL AND METHOD OF PRODUCING SAME

(75) Inventors: Koichi Asai, Nagoya (JP); Yasuo Muto, Chiryu (JP); Kazuya Suzuki, Toyota (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/093,607

(22) Filed: Mar. 11, 2002

(65) Prior Publication Data

US 2002/0096207 A1 Jul. 25, 2002

Related U.S. Application Data

(63) Continuation of application No. 09/711,516, filed on Nov. 14, 2000, now Pat. No. 6,399,412.

(30) Foreign Application Priority Data

Nov. 17, 1999 (JP) ............................................. 11-326274
Nov. 8, 2000 (JP) ....................................... 2000-339860

(51) Int. Cl.$^7$ ....................... H01L 31/042; H01L 31/05; H01L 31/18; H01L 31/052
(52) U.S. Cl. ...................... 136/250; 136/261; 136/244; 438/63; 438/64; 257/461; 257/465; 257/466
(58) Field of Search ................................ 136/250, 261, 136/244; 438/63, 64; 257/461, 465, 466

(56) References Cited

U.S. PATENT DOCUMENTS 2,904,613 A * 9/1959 Paradise ..................... 136/250
3,025,335 A    3/1962 Ralph ......................... 136/250
4,407,320 A   10/1983 Levine ........................ 136/250
4,514,580 A *  4/1985 Bartlett ...................... 136/250
4,521,640 A    6/1985 Levine et al.
4,582,588 A    4/1986 Jensen et al. ............... 136/250
4,691,076 A    9/1987 Levine et al.
5,498,576 A    3/1996 Hotchkiss et al.
6,204,545 B1   3/2001 Nakata ........................ 257/459
6,355,873 B1 * 3/2002 Ishikawa ..................... 136/250
6,399,412 B1 * 6/2002 Asai et al. .................... 438/63
6,417,442 B1 * 7/2002 Fukui et al. ................. 136/250

FOREIGN PATENT DOCUMENTS

| EP | 0866506 | 9/1998 |
| JP | A 3-76273 | 4/1991 |
| JP | A 6-13633 | 1/1994 |
| JP | A 7-335925 | 12/1995 |

* cited by examiner

Primary Examiner—Alan Diamond
(74) Attorney, Agent, or Firm—Oliff & Berridge, PLC (57) ABSTRACT

Producing a photovoltaic panel, including forming holes in a first electrode plate, fitting, in the holes, photovoltaic elements, each having a P-N junction between a core and a shell, electrically connecting a first portion of the shell of each photovoltaic element to the first electrode plate, removing one second portion of the shell of each photovoltaic element located on both sides of the first portion of the shell, so that a third portion of the core of the each photovoltaic element that corresponds to the one second portion of the shell is exposed, and electrically connecting the third portion of the core of each photovoltaic element to a second electrode plate, wherein electrically connecting the first portion and electrically connecting the third portion includes soldering, a corresponding one of the first portion and the third portion to a corresponding one of the first electrode plate and the second electrode plate.

15 Claims, 7 Drawing Sheets

PHOTOVOLTAIC PANEL AND METHOD OF PRODUCING SAME

This is a Continuation of application Ser. No. 09/711,516 filed Nov. 14, 2000, now U.S. Pat. No. 6,399,412. The entire disclosure of the prior application(s) is hereby incorporated by reference herein in its entirety.

BACKGROUND OF THE INVENTION

1. Field of the Invention

The present invention relates to a photovoltaic panel including a plurality of photovoltaic elements and a method of producing a photovoltaic cell.

2. Discussion of Related Art

Japanese Patent Document No. 6(1994)-13633 discloses a method of producing a photovoltaic panel. This method includes (a) the step of forming a number of holes in an aluminum foil as an electrically conductive member; (b) the step of fitting, in each of the thus formed holes, a photovoltaic element having P-N junction between a core portion and a shell portion; (c) the first connecting step of pressing, by impact pressing, the photovoltaic elements which have been heated up to 500° C. to 577° C., into the holes and then cooling those elements down to the room temperature, so that the conductive member is electrically connected to the shell portion of each photovoltaic element; (d) the step of removing one of respective half portions of the shell that correspond to the opposite major surfaces of the conductive member, so that the respective cores of the photovoltaic elements are partly exposed; (e) the step of forming an electrically insulating layer on the exposed portions of the cores of the photovoltaic elements and the corresponding one major surface of the conductive member; (f) the step of polishing portions of the insulating layer covering the cores of the photovoltaic elements, so that the cores are partly exposed and (g) the second connecting step of electrically connecting a second electrically conductive plate-like member to the thus exposed portions of the cores of the photovoltaic elements.

SUMMARY OF THE INVENTION

The present invention provides a photovoltaic-panel producing method and a photovoltaic panel which have one or more of the following technical features that are described below in respective paragraphs given parenthesized sequential numbers (1) to (20). Any technical feature that includes another technical feature shall do so by referring, at the beginning, to the parenthesized sequential number given to the latter feature. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a method of producing a photovoltaic panel, comprising the steps of forming a plurality of holes in a first electrode plate, fitting, in the plurality of holes, a plurality of photovoltaic elements, respectively, each of which has a P-N junction between a core portion thereof and a shell portion thereof, electrically connecting a first portion of the shell portion of the each photovoltaic element to the first electrode plate, removing one of opposite second portions of the shell portion of the each photovoltaic element that are located on both sides of the first portion of the shell portion, so that a third portion of the core portion of the each photovoltaic element that corresponds to the one second portion of the shell portion is exposed, and electrically connecting the third portion of the core portion of the each photovoltaic element to a second electrode plate, wherein at least one of the step of electrically connecting the first portion and the step of electrically connecting the third portion comprises soldering, with a solder, a corresponding one of the first portion and the third portion to a corresponding one of the first electrode plate and the second electrode plate.

In the present photovoltaic-panel producing method, the electrical connection between each of the photovoltaic elements and at least one of the first and second electrode plates is done by soldering. In contrast, in the first connecting step of the conventional producing method, each photovoltaic element and an electrically conductive member are connected by diffused junction in which two elements are bonded to each other by utilizing the diffusion of atoms occurring at the interface of the two elements. A device for carrying out the diffused junction is expensive, and needs to be used at a high temperature not lower than 500° C. Moreover, the diffused junction needs a long time. The soldering, utilized in the present method, does not need an expensive device. In addition, the solder can be molten at a temperature (from 150° C. to 300° C. depending on sorts) which is considerably lower than a temperature at which the diffused junction is done. Since the solder is easily molten, the electrical connection can be done, by the soldering, in a shorter time. The core portion and shell portion of each photovoltaic element may be connected, either directly or indirectly, to the first and second electrode plates, respectively.

(2) According to a second feature of the present invention that includes the first feature (1), the photovoltaic-panel producing method further comprises forming the each photovoltaic element from a silicon-based material, so that the each element has the P-N junction between the core portion and the shell portion, and forming a to-be-soldered layer from a material having a good capability to be connected to both the solder and the silicon-based material, so that the to-be-soldered layer covers at least the first portion of the shell portion of the each photovoltaic element.

Thus, the to-be-soldered layer is formed from the material having the good capability to be connected to both the solder and the photovoltaic element. This capability can be called as a capability to be connected to metals, or an affinity to metals. The to-be-soldered layer may cover the entire outer surface of each photovoltaic element or a portion of the outer surface of the same. The to-be-soldered layer may be formed by plating. The plating may be either electrolytic plating or chemical (i.e., electroless) plating. Since the chemical plating can be carried out by a cheaper device, it contributes to reducing the production cost of the photovoltaic panel. The material from which the to-be-soldered layer is formed may comprise at least one of nickel, titanium, cobalt, palladium, gold, and silver. A material comprising nickel or titanium is preferable.

(3) According to a third feature of the present invention that includes the second feature (2), the step of electrically connecting the first portion comprises soldering the to-be-soldered layer covering the first portion of the shell portion, to the first electrode plate.

Since the shell portion of each photovoltaic element is soldered to the first electrode plate via the to-be-soldered layer, the shell portion is more easily connected to the electrode plate than the case where the former is directly connected to the latter.

(4) According to a fourth feature of the present invention that includes the second or third feature (2) or (3), the to-be-soldered layer additionally covers the one second portion of the shell portion, and wherein the step of removing the one second portion comprises removing both the to-be-soldered layer covering the one second portion, and the one second portion.

The to-be-soldered layer can be removed by using a plating releasing or removing agent, and the shell portion can be removed by using an etching agent or liquid. The remaining portion of the to-be-soldered layer that is other than the portion thereof to be connected by the soldering, may be removed when the one second portion of the shell portion is removed. It is preferred that the plating removing agent be selected from one of those which are not influential to the solder. For example, a strong acid removing agent is preferable. The etching agent may be selected from strong acids such as sulfuric acid, nitric acid, hydrochloric acid, or hydrogen fluoride. For example, a mixture of nitric acid and hydrogen fluoride is preferably used to remove the shell portion.

(5) According to a fifth feature of the present invention that includes any one of the first to fourth features (1) to (4), the photovoltaic-panel producing method further comprises forming, after the one second portion of the shell portion of the each photovoltaic element is removed and the third portion of the core portion of the each element is exposed, an electrically insulating layer to cover the third portion of the core portion of the each element and at least a portion of one of opposite surfaces of the first electrode plate, and removing the insulating layer covering the third portion of the core portion of the each photovoltaic element, so that the third portion of the core portion is exposed.

The insulating layer is so formed as to cover the exposed, third portions of the core portions of the photovoltaic elements, and respective portions of the insulating layer that are to be connected to the second electrode plate are removed. Since the insulating layer is provided between the first and second portions of each photovoltaic element that are connected to the first and second electrode plates, respectively, respective conductive layers of the first and second electrode plates are reliably insulated. For example, when the core portion of each photovoltaic element is soldered to the second electrode plate, the solder may climb up along the core portion of the each element. Even in this case, the insulating layer can effectively prevent the solder from reaching the conductive layer of the first electrode plate. It is preferred that the insulating layer be highly capable of electrical insulation. If the insulating layer is formed of a material which is highly capable of application, it is easily formed. For example, the insulating layer may be formed of a synthetic resin such as an acrylic resin, a urethane resin, or an epoxy resin. It is preferred that the insulating layer be removed by a mechanical method such as sand blasting. However, it is not essentially required that the insulating layer be formed on the core portion of each photovoltaic element, because, as described later, the first electrode plate may include an insulating layer which insulates the respective conductive layers of the first and second electrode plates from each other.

(6) According to a sixth feature of the present invention that includes the fifth feature (5), the photovoltaic-panel producing method further comprises forming the each photovoltaic element from a silicon-based material, so that the each element has the P-N junction between the core portion and the shell portion, and forming a to-be-soldered layer from a material having a good capability to be connected to both the solder and the silicon-based material, so that the to-be-soldered layer covers the exposed, third portion of the core portion of the each photovoltaic element.

This to-be-soldered layer may be formed from the same material as that from which the to-be-soldered layer recited in the second feature (2) is formed, in the same manner as that in which the latter layer is formed.

(7) According to a seventh feature of the present invention that includes the sixth feature (6), the step of electrically connecting the third portion comprises soldering the to-be-soldered layer covering the third portion of the core portion, to the second electrode plate.

In this photovoltaic panel, the core portion of each photovoltaic element is connected to the second electrode plate via the to-be-soldered layer.

(8) According to an eighth feature of the present invention that includes any one of the first to seventh features (1) to (7), the photovoltaic-panel producing method further comprises forming at least one of the first electrode plate and the second electrode plate, by coating at least a portion of one of opposite surfaces of a substrate with the solder.

The substrate may be an electrically insulating layer formed of a synthetic resin, an electrically conductive layer formed of an electrically conductive material, or the combination of an insulating layer and a conductive layer which are superposed on each other. If the substrate has a high rigidity, the holes can be easily formed by punching. The solder may coat one entire surface of the substrate, or only a certain portion of one surface of the same.

(9) According to a ninth feature of the present invention that includes the eighth feature (8), the step of forming the holes comprises forming the holes such that an area of an opening of each of the holes that opens on the side of the one surface of the substrate that is coated with the solder, is smaller than an area of an opening of the each hole that opens on the side of the other surface of the substrate.

Since the area of opening of each of the holes that opens on the side of the one surface of the substrate that is coated with the solder (hereinafter, referred to as "the side of the solder layer") is smaller than the area of opening of the same hole that opens on the side of the other surface of the substrate, the step of removing the shell portion can be easily carried out. In addition, a broader area of the shell portion can be removed. If the diameter of the opening of each hole on the side of the solder layer is somewhat smaller than that of each photovoltaic element, then the each element can be reliably fixed, by fitting, to the first electrode plate. In the case where the holes are formed by punching with a punch, it is desirable that the punch be used on the first electrode plate from the side of the solder layer toward the other side. In this case, the area of opening of each hole on the side of the solder layer is naturally made smaller than the area of opening of the same hole that opens on the other side. In addition, the holes are formed with accurate dimensions. Therefore, the photovoltaic elements are advantageously fitted in respective portions of the holes that are located on the side of the solder layer.

(10) According to a tenth feature of the present invention that includes any one of the first to ninth features (1) to (9), the step of electrically connecting the first portion and the step of electrically connecting the third portion comprise concurrently carrying out both the step of electrically connecting the first portion and the step of electrically connecting the third portion.

For example, in the case where both. the step of electrically connecting the first portion (i.e., the first connecting step) and the step of electrically connecting the third portion (i.e., the second connecting step) are done by soldering, those two steps may be carried out concurrently. In this case, the total number of steps can be reduced, that is, the total time needed to carry out all the steps can be reduced. Thus, the photovoltaic panel can be produced at reduced cost. For example, after the hole forming step, the fitting step, and the removing step are carried out, the core portion may be connected to the second electrode plate while the shell portion is connected to the first electrode plate. For example, each photovoltaic element which is being heated is pressed against the second electrode plate. In this manner, the shell portion is electrically connected to the first electrode plate, and concurrently the core portion is electrically connected to the second electrode plate. However, the first and second connecting steps may be carried out separately from each other. For example, the hole forming step, the fitting step, the first connecting step, the removing step, and the second connecting step may be carried out in this order. More specifically described, after each photovoltaic element is fitted in the hole formed in the first electrode plate, the shell of the each element is connected to the first electrode plate, and then the removing step and the second connecting step are carried out. If in each of the first and second connecting steps, the electrical connection is done by soldering, it is preferred that the melting point of the solder used in the second connecting step be lower than that of the solder used in the first connecting step. Since the solder used in the second connecting step is heated to a temperature lower than that to which the solder used in the first connecting step is heated, the photovoltaic elements which have been connected to the first electrode plate in the first connecting step are effectively prevented from floating on the solder which would otherwise be molten again.

(11) According to an eleventh feature of the present invention that includes any one of the first to tenth features (1) to (10), at least one of the step of electrically connecting the first portion and the step of electrically connecting the third portion comprises pressing the each photovoltaic element against a corresponding one of the first electrode plate and the second electrode plate.

It is preferred that the soldering be carried out while each photovoltaic element is pressed against the first and/or second electrode plates. However, this is not essentially required. The eleventh feature (1) just requires that the pressing be done during at least a portion of a time duration in which the soldering is carried out.

(12) According to a twelfth feature of the present invention, there is provided a method of producing a photovoltaic panel, comprising the steps of forming a plurality of holes through a thickness of a first electrode plate including an electrically insulating layer and an electrically conductive layer which are superposed on each other, fitting, in the plurality of holes, a plurality of photovoltaic elements, respectively, each of which has a P-N junction between a core portion thereof and a shell portion thereof, removing a first portion of the shell portion of the each photovoltaic element that is located on the side of the insulating layer of the first electrode plate, so that a second portion of the core portion of the each photovoltaic element that corresponds to the first portion of the shell portion is exposed, electrically connecting a third portion of the shell portion of the each photovoltaic element to the conductive layer of the first electrode plate, and electrically connecting the exposed, second portion of the core portion of the each photovoltaic element to a second electrode plate.

In the present photovoltaic-panel producing method, the plurality of holes are formed in the first electrode plate including the insulating layer and the conductive layer, and the photovoltaic elements are fitted in the holes, respectively. The present method employs the first electrode plate which has the insulating layer, and no new insulating layer is formed on the exposed core portion of each photovoltaic element. Therefore, the present method does not need a polishing step for polishing and removing a portion of the insulating layer before the core portion is electrically connected to the second electrode plate. Thus, since the total number of steps of the present method can be reduced as compared with that of the conventional producing method, the present method can produce the photovoltaic panel at reduced cost.

The producing method according to the twelfth feature (12) may employ any one of the above-described first to eleventh technical features (1) to (11).

(13) According to a thirteenth feature of the present invention, there is provided a photovoltaic panel comprising a first electrode plate having a plurality of holes; a plurality of photovoltaic elements each of which has a P-N junction between a core portion thereof and a shell portion thereof covering a first portion of the core portion, and which are fitted in the plurality of holes, respectively, such that the shell portion of each of the photovoltaic elements is electrically connected to the first electrode plate; and a second electrode plate which is electrically connected to a second portion of the core portion of the each photovoltaic element that is opposite to the shell portion thereof and is not covered by the shell portion, wherein at least one of the shell portion, and the second portion of the core portion, of the each photovoltaic element is electrically connected, by soldering, with a solder, to a corresponding one of the first electrode plate and the second electrode plate.

(14) According to a fourteenth feature of the present invention that includes the thirteenth feature (13), the each photovoltaic element is formed from a silicon-based material and additionally includes a to-be-soldered layer which is formed from a material having a good capability to be connected to both the solder and the silicon-based material, so that the to-be-soldered layer covers the at least one of the shell portion and the second portion of the core portion and the at least one of the shell portion and the second portion of the core portion is electrically connected via the to-be-soldered layer to the corresponding one of the first electrode plate and the second electrode plate.

In the present photovoltaic panel, each photovoltaic element is connected, by soldering, to the first and/or second electrode plates via the to-be-soldered layer.

(15) According to a fifteenth feature of the present invention that includes the fourteenth feature (14), the material from which the to-be-soldered layer is formed comprises at least one of nickel, nickel alloys, titanium, copper, cobalt, palladium, gold, and silver.

It is preferred that the to-be-soldered layer be formed, by plating, of a nickel alloy. The nickel alloy may be selected from nickel-cobalt-phosphorus alloy (Ni—Co—P), nickel-iron-phosphorus alloy (Ni—Fe—P), nickel-tungsten-phosphorus alloy (Ni—W—P), nickel-rhenium-phosphorus alloy (Ni—Re—P), nickel-palladium-phosphorus alloy (Ni—Pd—P), nickel-copper-phosphorus (Ni—Cu—P), nickel-tin-phosphorus alloy (Ni—Sn—P), nickel-zincphosphorus alloy (Ni—Zn—P), nickel-manganese-phosphorus alloy (Ni—Mn—P), nickel-rhenium-tungsten-phosphorus alloy (Ni—Re—W—P), nickel-rhenium-tin-phosphorus alloy (Ni—Re—Sn—P), and nickel-rhenium-zinc-phosphorus alloy (Ni—Re—Zn—P).

(16) According to a sixteenth feature of the present invention that includes the fourteenth or fifteenth feature (14) or (15), at least one of the first electrode plate and the second electrode plate comprises an electrically insulating substrate and an electrically conductive, solder layer which coats at least a portion of one of opposite surfaces of the substrate.

The first and second electrode plates may, or may not be, identical with each other. Each electrode plate may be provided by the combination of a conductive layer and a solder layer coating one surface of the conductive layer (i.e., a one-conductive-layer structure); the combination of an insulating layer, a conductive layer, and a solder layer coating one surface of the conductive layer (i.e., a one-conductive-layer-and-one-insulating-layer structure); or the combination of an insulating layer and a solder layer directly coating one surface of the insulating layer. In the last case, the solder layer functions as a conductive layer. Each conductive layer may be provided by a copper or nickel sheet which is coated with a nickel plating. Each insulating layer may be formed of a synthetic resin such as a phenol resin or a glass fiber reinforced plastics. Thus, the first electrode plate can be called as a ball arranging substrate. In addition, at least one of the first and second electrode plates may be provided by a printed wiring board. Since generally a printed wiring board includes a conductive layer, it can be used as it is.

(17) According to a seventeenth feature of the present invention that includes any one of the thirteenth to sixteenth features (13) to (16), the photovoltaic panel further comprises an annular electrical insulator which covers an annular portion of the core portion of the each photovoltaic element that is located between the first and second portions thereof.

Since the annular electrical insulator covers the annular portion of the core portion of each photovoltaic element that is located between the first and second portions thereof that are eventually connected to the first and second electrode plates, respectively, the first and second electrode plates can be reliably insulated from each other.

(18) According to an eighteenth feature of the present invention that includes any one of the thirteenth to seventeenth features (13) to (17), the first electrode plate comprises an electrically insulating substrate and an electrically conductive, solder layer which coats at least a portion of one of opposite surfaces of the substrate, and wherein an area of an opening of each of the holes that opens on the side of the one surface of the substrate is smaller than an area of an opening of the each hole that opens on the side of the other surface of the substrate.

(19) According to a nineteenth feature of the present invention, there is provided a photovoltaic panel comprising a first electrode plate including an electrically insulating layer and a first electrically conductive layer which are superposed on each other, the first electrode plate having a plurality of holes formed through a thickness thereof; a plurality of photovoltaic elements each of which has a P-N junction between a core portion thereof and a shell portion thereof covering at least a first portion of the core portion that is located on the side of the first conductive layer of the first electrode plate, and which are fitted in the plurality of holes, respectively, such that the shell portion of each of the photovoltaic elements is electrically connected to the first electrode plate; and a second electrode plate including a second electrically conductive layer which is electrically connected to a second portion of the core portion of the each photovoltaic element that is located on the side of the insulating layer of the first electrode plate and is not covered by the shell portion.

In the present photovoltaic panel, the first electrode plate including the insulating layer and the first conductive layer has the plurality of holes, and the photovoltaic elements are fitted in the holes, respectively. One half portion of the core portion of each photovoltaic element that is located on the side of the first conductive layer of the first electrode plate is covered by the shell portion, and at least a portion of the other half portion of the core portion that is located on the side of the insulating layer is exposed and is electrically connected to the second electrode plate. Upon incidence of a light to the shell portion on the side of the first conductive layer, an electric current flows between the first and second conductive layers via an external resistor.

The present photovoltaic panel may employ any one of the above-described thirteenth to eighteenth features (13) to (18).

(20) According to a twentieth feature of the present invention that includes the nineteenth feature (19), the photovoltaic panel further comprises an annular space which surrounds an annular portion of the core portion of the each photovoltaic element that is located between the first and second portions thereof.

In the present photovoltaic panel, the annular space functions as an insulator. This insulator is not formed by chemical treatment, and the annular space is not filled with an insulating material in a molten state. Thus, the air present in the annular space functions as the insulator.

BRIEF DESCRIPTION OF THE DRAWINGS

The above and other objects, features, advantages and technical and industrial significance of the present invention will be better understood by reading -the following detailed description of preferred embodiments of the invention, when considered in connection with the accompanying drawings, in which.

DETAILED DESCRIPTION OF PREFERRED EMBODIMENTS

Hereinafter, there will be described a photovoltaic panel and a method of producing a photovoltaic panel, to both of which the present invention is applied, by reference to the drawings.

Figure 1:
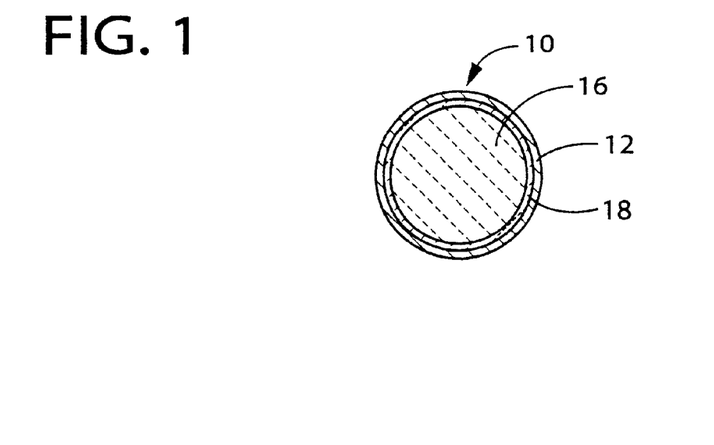
FIG. 1 is a view for explaining a to-be-soldered-layer forming step of a photovoltaic-panel producing method embodying the present invention.

In FIG. 1, reference numeral 10 designates a representative one of a plurality of silicon balls each as a photovoltaic element. A nickel layer 12 as a to-be-soldered layer is formed on an outer surface of the silicon ball 10. This is the step of forming the to-be-soldered layer.

The silicon ball 10 includes a core portion 16 as a P-type silicon and a shell portion 18 as an N-type silicon. For example, the shell 18 or the N-type silicon is formed by doping an impurity such as arsenic into an outermost layer of the P-type silicon ball.

In the present embodiment, the nickel layer 12 is formed by subjecting the silicon ball 10 to chemical plating (i.e., electroless plating). More specifically described, the nickel layer 12 is formed on an outer surface of the silicon ball 10 by immersing the ball 10 in a plating bath including a nickel salt such as nickel sulfate and a reducing agent such as sodium hypophosphite or potassium boron hydride.

Since the to-be-soldered layer 12 is formed of nickel, the cost of production of the layer 12 is lower than that of a layer formed of gold or silver. In addition, the nickel enjoys the advantage that it influences little to the silicon ball 10.

Figure 2:
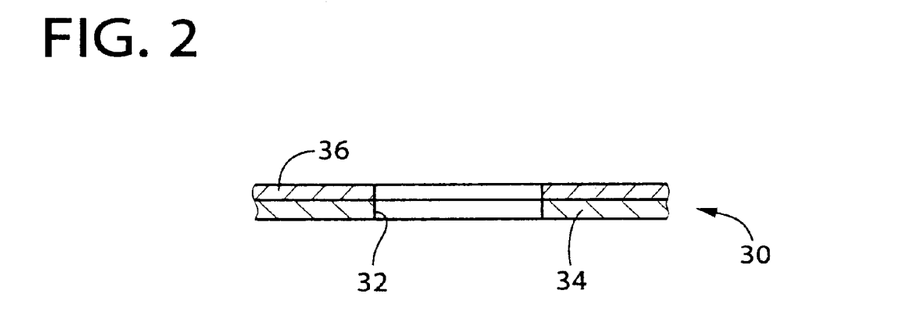
FIG. 2 is a view for explaining a hole forming step of the method of FIG. 1.

As shown in FIG. 2, a number of holes 32 is formed through the thickness of a first electrode plate 30. This is the step of forming the holes. The first electrode plate 30 is formed by carrying out a solder-precoating treatment on one major surface of an electrically conductive layer 34 (This is the electrode-plate formation). Thus, the first electrode plate 30 includes the conductive layer 34 and the solder layer 36 which are stacked on one another. In the present embodiment, the conductive layer 34 is formed of copper, and the solder layer 36 is formed by coating, on the copper layer 34, a binary alloy (i.e., a solder) which includes 95 parts by weight of tin and 5 parts by weight of silver. The melting point of this solder is considerably high, 245° C. As will be described later, the melting point (245° C.) of the solder of the solder layer 36 of the first electrode plate 30 is higher than that of the solder of a solder layer of a second electrode plate, so that during a second connecting step following a first connecting step, the first electrode plate 30 is prevented from being molten again.

It is preferred that the thickness of the solder layer 36 be equal to the proportion of from 15% to 20% of the thickness of the conductive layer 34. However, this is not an essential requirement, and the proportion of the thickness of the solder layer 36 to that of the conductive layer 34 may be not less than 5%, not less than 10%, not less than 15%, not less than 20%, or not less than 25%. Likewise, it is preferred that the proportion of the thickness of the solder layer 36 to that of the conductive layer 34 may be not more than 5%, not more than 20%, not more than 25%, not more than 30%, or not more than 35%.

Each of the holes 32 has a generally cylindrical shape, and the diameter of opening of the each hole 32 is somewhat smaller than the diameter of the silicon ball 10 formed with the nickel layer 12. A punching machine is used to punch the holes 32 through the thickness of the first electrode plate 30. However, the holes 32 may be formed by drilling, or by using a chemical reaction such as etching.

Figure 3:
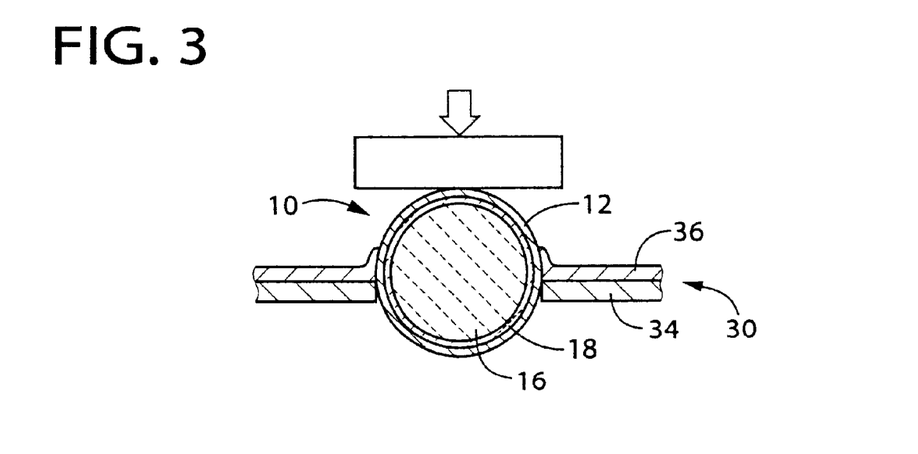
FIG. 3 is a view for explaining a first connecting step of the method of FIG. 1.

As shown in FIG. 3, after the silicon balls 10 are fitted in the respective holes 32 of the first electrode plate 30, the balls 10 are electrically connected to the first electrode plate 30. This is the fitting step or the first connecting step. A number of silicon balls 10 are fitted in, and fixed to, respective holes 32 of the first electrode plate 30, by first placing the balls 10 on one major surface of the plate 30 and then applying vacuum to the other major surface of the plate 30. Subsequently, a pressing device is operated to press the silicon balls 10 which have been heated, against the first electrode plate 30 which has also been heated. Consequently the solder layer 36 is molten and bonded to the to-be-soldered layer 12 of each silicon ball 10, so that the each ball 10 is electrically connected to the first electrode plate 30. Thus, each silicon ball 10 is advantageously connected via the nickel layer 12 to the first electrode plate 30.

It is desirable that the first connecting step be carried out in the atmosphere of inert gas in a re-flow heating furnace. When the first connecting step is carried out in the atmosphere of inert gas, the solder is effectively prevented from spreading too wide and from producing bubbles.

The silicon balls 10 are heated to a temperature which assures that the solder is molten and bonded to the silicon balls 10. In the present embodiment, this temperature is selected at a value, 295° C., higher by about 50° C. than the melting point, 245° C., of the solder. The temperature of 295° C. is lower than the temperature, 530° C., at which diffused junction is carried out in a conventional method.

The pressing force which is applied by the pressing device to the silicon balls 10 is selected at a value which assures that the balls 10 can be fitted in the holes 32 of the first electrode plate 30. This may be a small value. The application of the pressing force effectively prevents the solder from permeating from the one major surface of the conductive layer 34 on which the solder layer 36 is provided, to the other surface of the layer 34, and thereby preventing the balls 10 from floating on the molten solder. The first connecting step can be said as a heating and pressing step.

However, the first connecting step may be carried out in an ambient air.

Figure 4:
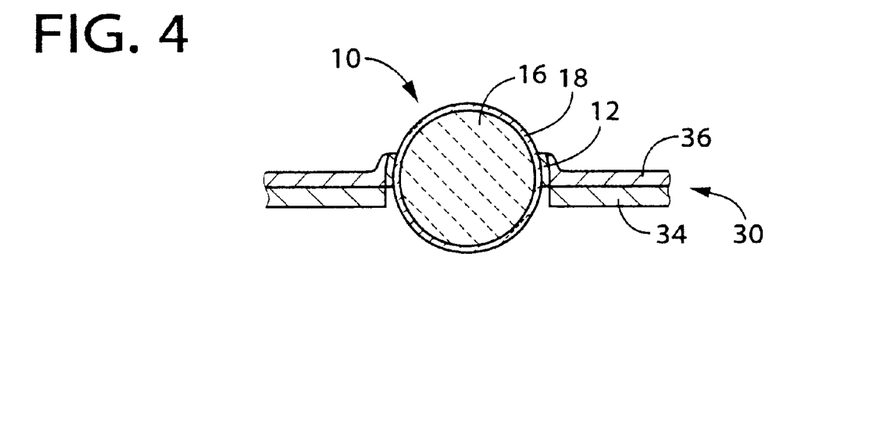
FIG. 4 is a view for explaining a to-be-soldered-layer removing step of the method of FIG. 1.

As shown in FIG. 4, the nickel layer 12 is removed. This is the step of removing the to-be-soldered layer. The nickel layer 12 is removed by using a plating removing agent as a liquid. Since the nickel layer 12 is not transparent, i.e., does not transmit light, this layer 12 needs be removed on one side of the first electrode plate 30 that is exposed to light.

As the plating removing agent, a strong base agent is used. If a strong acid agent is used, the solder might be dissolved into the agent. The strong base agent or liquid is applied to the nickel layer 12 to remove the same 12.

Figure 5:
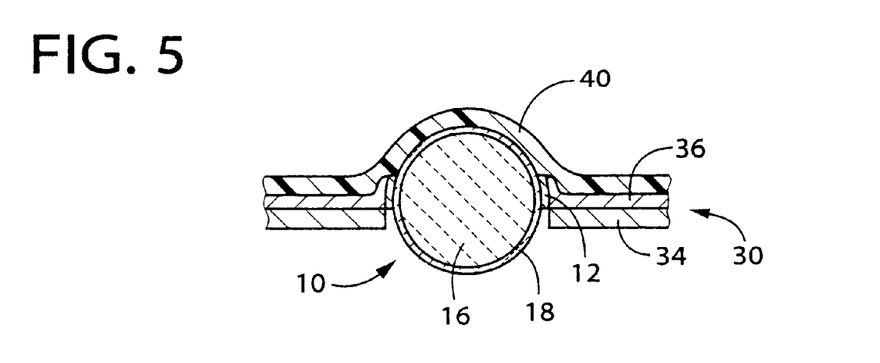
FIG. 5 is a view for explaining a protective-layer forming step of the method of FIG. 1.

As shown in FIG. 5, a protective layer 40 is formed on the one side of the first electrode plate 30 that is exposed to light. This is the step of forming the protective layer. The protective layer 40 is formed of a highly light-transmitting (or transparent) material such as resin (e.g., a transparent resin) or ceramics (e.g., glass). The protective layer 40 is provided for the purposes of protecting the silicon balls 10 and the first electrode plate 30 against solvents (or chemicals) and/or heat which will be used in subsequent steps, preventing the balls 10 and the plate 30 from being damaged by colliding with foreign matters, and effectively utilizing the light incident to the silicon balls 10.

To these ends, it is desirable that the protective layer 40 be formed of a material which is excellent with respect to electrical insulation, heat resistance, and chemical resistance and which prevents reflection of light and promotes scattering and containing of light. In addition, if the protective layer 40 is formed of a material which is excellent with respect to workability (i.e., the degree of applicability), the layer 40 is easily formed. For example, the protective layer 40 is formed of acrylic resin, urethane resin, or epoxy resin. The acrylic resin is the most desirable one of these resins.

Figure 6:
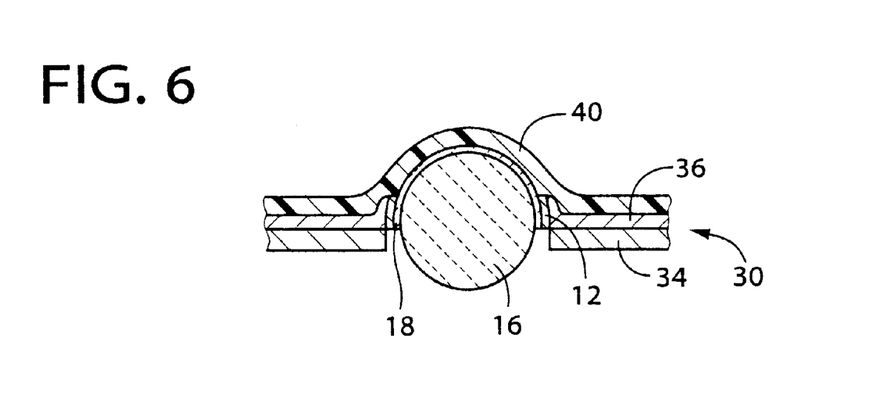
FIG. 6 is a view for explaining a shell-portion removing step of the method of FIG. 1.

As shown in FIG. 6, etching is carried out to remove a portion of the shell 18 (i.e., N-type silicon) of each silicon ball 10 that is located on the other side of the first electrode plate 30 on which the protective layer 40 is not provided. This is the step of removing the shell of each silicon ball. In the present embodiment, an etching agent or liquid including hydrogen fluoride and nitric acid is used. Consequently a portion of the core 16 or P-type silicon of each silicon ball 10 is exposed. Since the protective layer 40 protects the one side of the first electrode plate 30, no shells 8 are removed from the silicon balls 10 on the one side of the plate 30.

Figure 7:
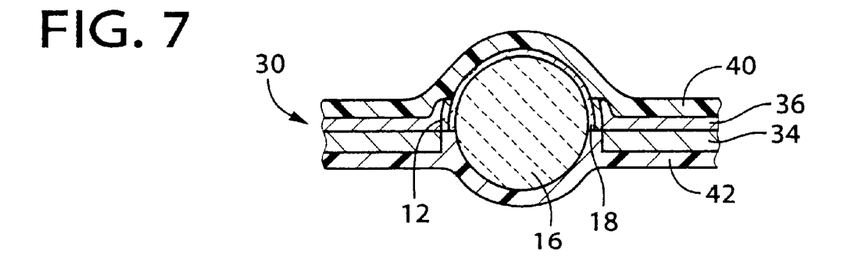
FIG. 7 is a view for explaining an electrically-insulating-layer forming step of the method of FIG. 1.

As shown in FIG. 7, an electrically insulating layer 42 is formed to cover the respective exposed portions of the cores 16 of the silicon balls 10 and the other side of the first electrode plate 30 on which the protective layer 40 is not provided. This is the step of forming the insulating layer. This insulating layer 42 need not have transparency, but it is preferred that the layer 42 be excellent with respect to heat resistance, chemical resistance, electrical insulation, and degree of applicability. Like the protective layer 40, the insulting layer 42 may be formed of acrylic resin, urethane resin, epoxy resin, or silicone resin.

In the case where the conductive layer 34 of the first electrode plate 30 is formed of aluminum, an aluminum-oxide film may be formed, by alumite treatment (anodic oxidation), as the insulating layer 42 on the aluminum layer (i.e., conductive layer) 34 and the exposed portions of the cores 16.

Figure 8:
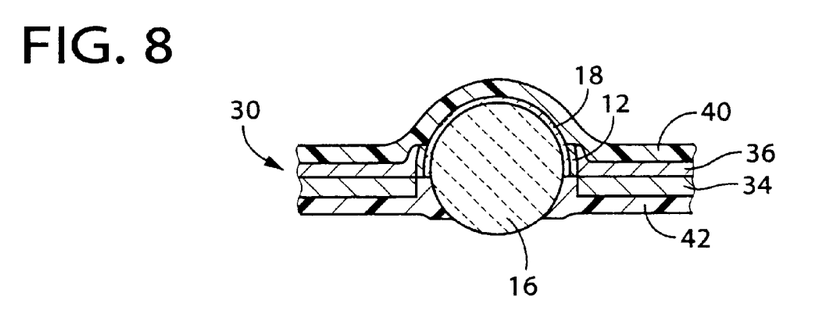
FIG. 8 is a view for explaining an insulating-layer removing step of the method of FIG. 1.

As shown in FIG. 8, respective portions of the insulating layer 42 that cover the respective portions of the cores 16 that are to be electrically connected to a second electrode plate 44. This is the step of removing the insulating layer, and can be said as the polishing step. In the present embodiment, sand blasting in which a polishing material such as sand is applied with a compressed air, is employed to remove the respective portions of the insulating layer 42.

Figure 9:
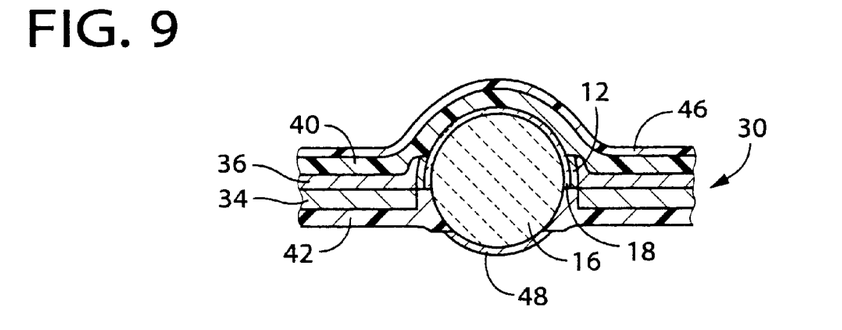
FIG. 9 is a view for explaining a to-be-soldered-layer forming step of the method of FIG. 1.

As shown in FIG. 9, a masking tape 46 is adhered to an outer surface of the protective layer 40 and subsequently a nickel layer 48 as a to-be-soldered layer is formed on the exposed portion of each core 16. This is the step of forming the to-be-soldered layer. The masking tape 46 is employed for preventing a plating agent or liquid from being adhered to the protective layer 40. The masking tape 46 is easily peeled from the protective layer 40, without damaging the outer surface of the layer 40, or without leaving any glue on the layer 40. Like the nickel layer 12, the nickel layer 48 is formed by chemical plating.

Though the masking tape 46 is not essentially needed, it is desirable to use the tape 46 for preventing the lowering of the transparency of the protective layer 40.

Figure 10:
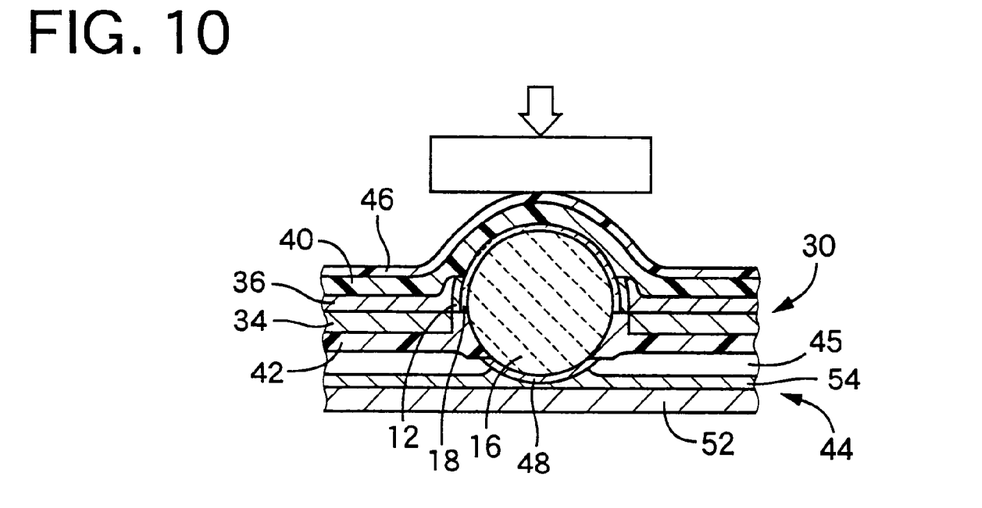
FIG. 10 is a view for explaining a second connecting step of the method of FIG. 1.

As shown in FIG. 10, the respective cores 16 of the silicon balls 10 are electrically connected via the respective nickel layers 48 to the second electrode plate 44 such that a vacant space 45 is present between the first electrode plate 30 and the second electrode plate 44. This is the second connecting step. More specifically described, a re-flow heating furnace accommodates the second electrode plate 44 such that the plate 44 is opposed to the respective nickel layers 48 formed on the cores 16, and a pressure is applied to the silicon balls 10 which have been heated. Like the first electrode plate 30, the second electrode plate 44 includes an electrically conductive layer 52 and a solder layer 54 which are stacked on each other. However, the solder layer 54 is formed of a ternary alloy (i.e., solder) including 15 parts by weight of lead, 5 parts by weight of silver, and 80 parts by weight of indium. The melting point, 157° C., of this solder is low and accordingly the second connecting step is carried out by heating the silicon balls 10 to a temperature not higher than 200° C. at which the solder of the solder layer 36 that electrically connects the first electrode plate 30 to the silicon balls 10 is not molten. Thus, the balls 10 are effectively prevented from floating on the molten solder. Since the silicon balls 10 is pressed against the second electrode plate 44, the balls 10 are effectively connected to the plate 44.

Since the insulating layer 42 is provided, the solder of the solder layer 54 is prevented from moving ("climbing") along the outer surface of each core 16, when the second electrode plate 44 is connected to each silicon ball 10, or even reaching the first electrode plate 30 to cause short circuit between the first and second electrode plates 30, 44. That is, the insulating layer 42 reliably insulates the first and second electrode plates 30, 44 from each other.

Figure 11:
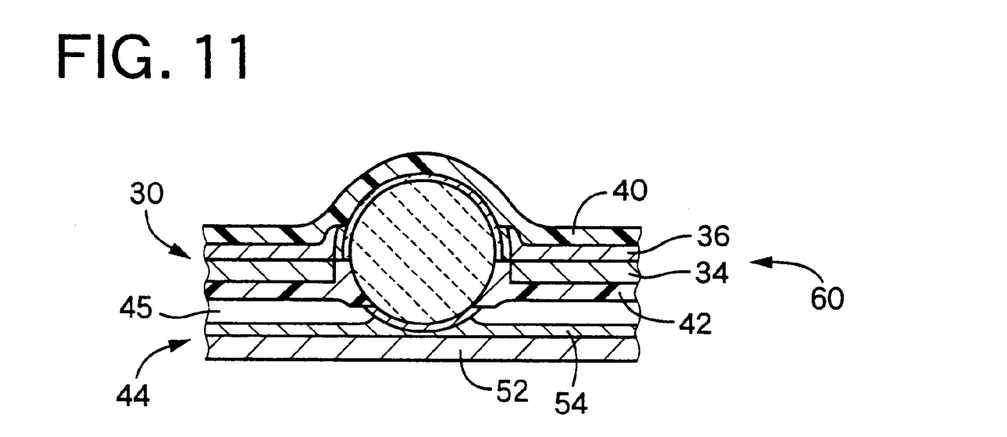
FIG. 11 is a partly cross-sectioned view of a photovoltaic panel produced according to the method including the steps of FIGS. 1 to 10.

Subsequently, the masking tape 46 is peeled, and a photovoltaic panel 60, shown in FIG. 11, is obtained. A solar battery is obtained by arranging a plurality of photovoltaic panels 60 in a common plane. When a natural light is incident to the protective layer (i.e., reflection-preventing coating) 40 of each photovoltaic panels 60, an electric current flows between the first and second electrode plates 30, 44 via an external resistor (not shown).

It emerges from the foregoing description that in the present producing method, each silicon ball 10 is connected to the first electrode plate 30 via the first solder layer 36, and to the second electrode plate 44 via the second solder layer 54. Therefore, the present method can be carried out with a cheaper device, at a lower temperature, and in a shorter time than the conventional, diffused junction is carried out. In addition, since each silicon ball 10 is supported by the first and second electrode plates 30, 44, the photovoltaic panel 60 as a whole enjoys a high strength.

In the illustrated embodiment, each of the first and second electrode plates 30, 44 includes the conductive layer and the solder layer. However, the conductive layer may be replaced with an insulating layer, or the combination of a conductive layer and an insulating layer. In the case where the conductive layer is replaced with the insulating layer, the solder layer functions as a conductive layer. In the last case, for example, a plate-like member which is formed of a synthetic resin such as a phenol resin or a glass fiber reinforced plastics is lined with a copper plate and subsequently is subjected to a solder-precoating treatment, to provide each electrode plate 30, 44.

In the case where the first electrode plate 30 includes the insulating layer, it is not essentially needed to provide the insulating layer 42 on the cores 16, because the insulting layer of the first electrode plate 30 can electrically insulate the respective conductive layers of the first and second electrode plates 30, 44. Depending upon the conditions (e.g., temperature) under which the second connecting step is carried out using the solder, or depending upon the sort of the solder used, it is possible to prevent the climbing of the solder.

The silicon balls 10 may be replaced with silicon balls each of which includes an N-type core portion and a P-type shell portion. I-type silicon may be interposed between the P-type silicon and the N-type silicon.

In the illustrated embodiment, the nickel layers 12, 48 are formed by chemical plating on each silicon ball 10. However, each nickel layer 12, 48 may be formed by a chemical vapor deposition (CVD) other than chemical plating, or a physical vapor deposition (PVD) such as vacuum vapor deposition or spattering.

The respective solder layers 36, 54 of the first and second electrode plates 30, 44 may be formed of two other solders than the above-described solders, so long as the respective melting points of the two other solders substantially differ from each other. In the latter case, it is desirable that the other solders have a bonding characteristic similar to that of the above-described solders.

Next, there will be described another photovoltaic-panel producing method as a second embodiment of the present invention, by reference to FIGS. 12 to 15.

Figure 12:
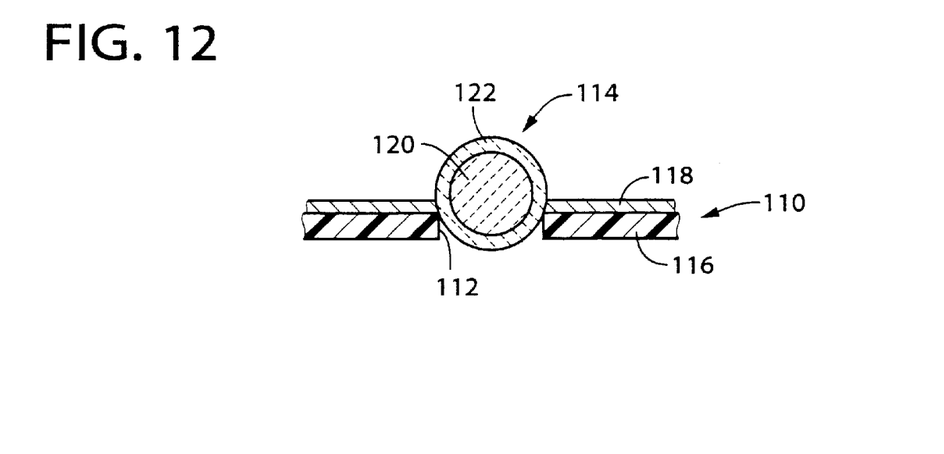
FIG. 12 is a view for explaining a hole-forming step and a fitting step of another photovoltaic-panel producing method as a second embodiment of the present invention.

As shown in FIG. 12, a number of holes 112 are formed in a first electrode plate 110, and a silicon ball 114 is fitted in each of the thus formed holes 112. These are the step of forming the holes and the step of fitting the silicon balls in the holes.

The first electrode plate 110 includes an electrically insulating layer 116 and a first electrically conductive layer 118. The insulating layer 116 is provided by a plate-like member which is formed of a synthetic resin such as a phenol resin. The first conductive layer 118 is formed by precoating a substantially entire portion of one of opposite major surfaces of the insulating layer 116, with a solder. When the thickness of the insulating layer 116 is 0.2 mm, the first conductive layer 118 is formed by applying the solder to the insulating layer 116 so as to have a thickness equal to 30 to 40$\mu$. As described previously, it is preferred that the proportion of the thickness of the first conductive layer 118 be equal to 15% to 20% of the thickness of the insulating layer 116. However, this is not essentially required, and it is possible that the proportion of the thickness of the first conductive layer 118 be equal to not less than 5%, not less than 10%, not less than 15%, not less than 20%, or not less than 25%, of that of the insulating layer 116. In addition, it is preferred that the proportion of the thickness of the first conductive layer 118 be equal to not more than 15%, not more than 20%, not more than 25%, not more than 30%, or not more than 35%, of that of the insulating layer 116. Thus, the first conductive layer 118 may be said as a solder layer. That is, the layer 118 functions as both a conductive layer and a connecting layer (i.e., a soldering layer).

Each of the silicon balls 114 has a spherical shape including a core portion 120 as P-type silicon and a shell portion 122 as N-type silicon.

Each of the holes 112 is formed such that an area of an opening of the each hole 112 that opens on the side of the first conductive layer 118 is smaller than an area of an opening of the same hole 112 that opens on the side of the insulating layer 116.

Figure 13:
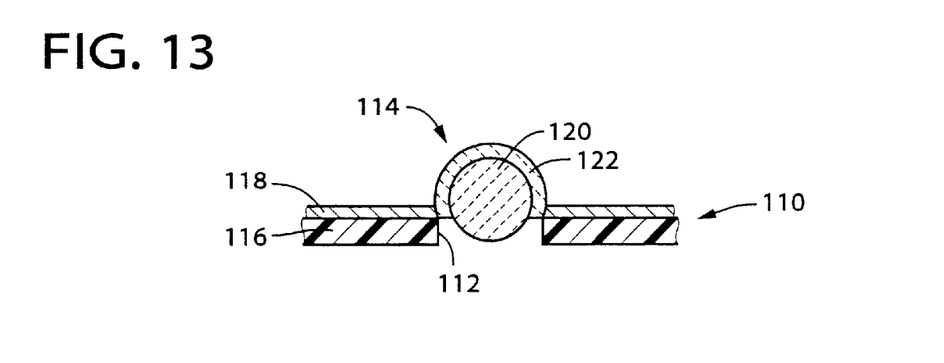
FIG. 13 is a view for explaining a removing step of the method of FIG. 12.

As shown in FIG. 13, a portion of the shell portion 122 that is located on the side of the insulating layer 116 of each silicon ball 114 is removed by etching. This is the removing step. The insulating layer 116 prevents the first conductive layer 118 from being adversely influenced by the etching.

Figure 14:
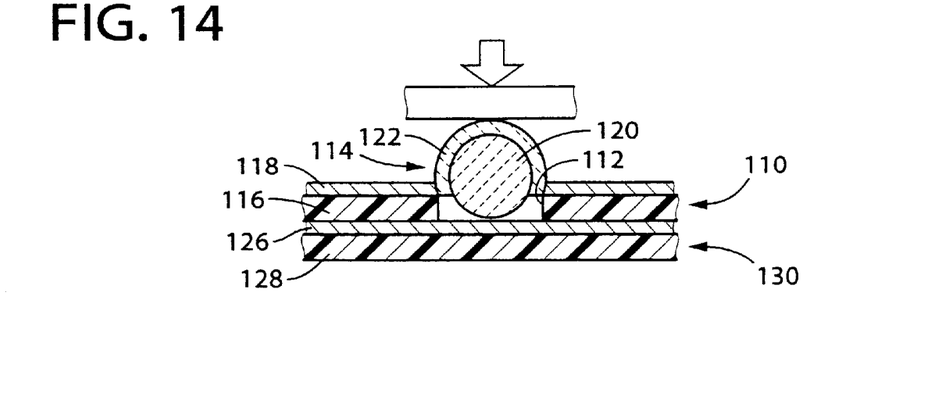
FIG. 14 is a view for explaining a first connecting step and a second connecting step of the method of FIG. 12.

As shown in FIG. 14, the shell portion 112 of each silicon ball 114 is electrically connected to the first conductive layer 118, and the core portion 120 is electrically connected to a second electrically conducive layer 126 of a second electrode plate 130. These are the first connecting step and the second connecting step.

The second electrode plate 130 includes, like the first electrode plate 110, the second conductive layer 126 and an insulating layer 128, and is provided on the side of the insulating layer 116 of the first electrode plate 110. In this state, the second conductive layer 126 faces toward the respective exposed cores 120 of the silicon balls 114 from which the respective shell portions 122 have been removed, and contacts the insulating layer 116 of the first electrode plate 110.

Next, a pressing device is operated to press the silicon balls 114 which have been heated, against the second electrode plate 130 which has been also heated. Consequently the solder layers 118, 126 are molten, so that the shell portion 122 of each silicon ball 114 is connected to the first conductive layer 118, and the core portion 120 of the same 114 is connected to the second conductive layer 126. This may be said as the reflowing step.

The silicon balls 114 and the first and second electrode plates 110, 130 are heated to a temperature which assures that the solder layers 118, 126 are molten and bonded to the silicon balls 114. Since the solders are materials which are molten at considerably low temperatures (e.g., 180 to 220° C.), the silicon balls 114 are connected to the first and second electrode plates 110, 130 at a lower temperature than that at which the conventional, diffused junction is carried out.

The pressing force applied to the silicon balls 114 is selected at a value which assures that the balls 114 are bonded to the first and second conductive layers 118, 126, and this value may be small. Since the pressing force just helps connect the silicon balls 114 to the first and second electrode plates 118, 126, it may not be great.

Figure 15:
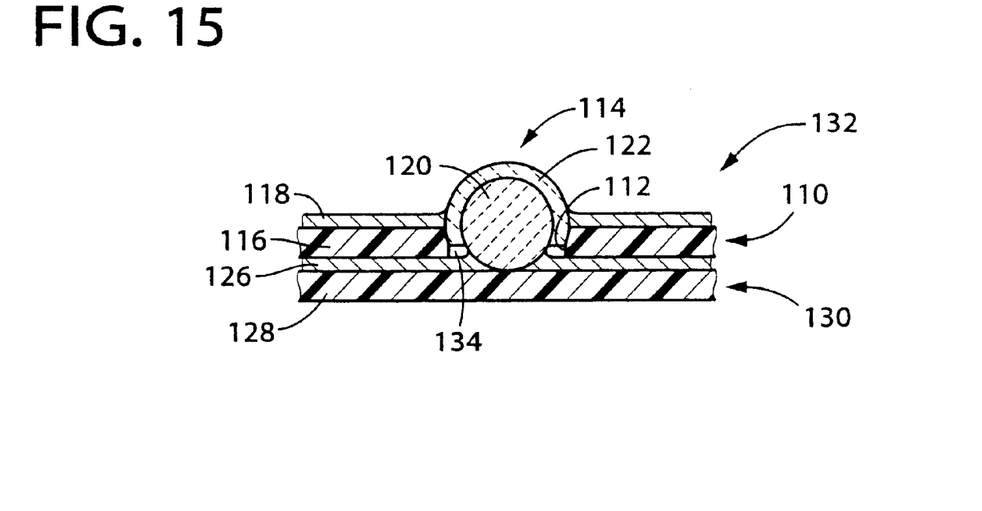
FIG. 15 is a partly cross-sectioned view of a photovoltaic panel produced according to the method including the steps of FIGS. 12 to 14.

Subsequently, a reflection-preventing coating is provided on respective portions (i.e., respective shell portions 122) of the silicon balls 114 that project out on the side of the first conductive layer 118 of the first electrode plate 110, and the outer surface of the first conductive layer 118. Thus, a photovoltaic panel 132, shown in FIG. 15, is obtained.

The present photovoltaic panel 132 includes an annular space 134 which externally covers an annular portion of the exposed core portion 120 of each silicon ball 114 that is different from a lower end portion thereof electrically connected to the second conductive layer 126 and does not contact the insulating layer 116. This annular space 134 provides an annular insulating layer. Since the insulating layer 116 is not one which is obtained by carrying out a chemical treatment on the outer surface of the exposed core portion 120, the exposed core portion 120 can have the annular portion which does not contact the insulating layer 116.

Thus, the first and second conductive layers 118, 126 are electrically insulated by the air present in the annular space or layer 134, and the weight of the photovoltaic panel 132 is accordingly reduced.

It emerges from the foregoing description that in the second embodiment, the first electrode plate 110 having the insulating layer 116 is employed. That is, no insulating layer is formed after the shell portion 122 of each silicon ball 114 is partly removed. Therefore, the second conductive layer 126 can be connected to the respective exposed core portions 120 of the silicon balls 114 from which the respective shell portions 122 have been removed. Since the present producing method does not need an insulating-layer polishing step which is needed in the conventional producing method, the present photovoltaic panel 132 can be produced at an accordingly reduced cost.

In addition, in the present embodiment, the first connecting step in which the shell portion 122 is connected to the first conductive layer 118 and the second connecting step in which the core portion 120 is connected to the second conductive layer 126 are concurrently carried out. Therefore, a total number of steps can be reduced, or a total time needed to produce the panel 132 can be reduced. Since the first and second connecting steps can be carried out at a lower temperature and a smaller pressing force than those at which the conventional producing method is carried out, as described above, a total energy needed to produce the panel 132 can be reduced.

In the second embodiment, each silicon ball 114 may additionally have a nickel layer outside the shell portion 122 and/or the exposed core portion 120. In the latter case, the shell portion 122 and/or the core portion 120 can be electrically connected to the solder layer or layers 118, 126.

Figure 16:
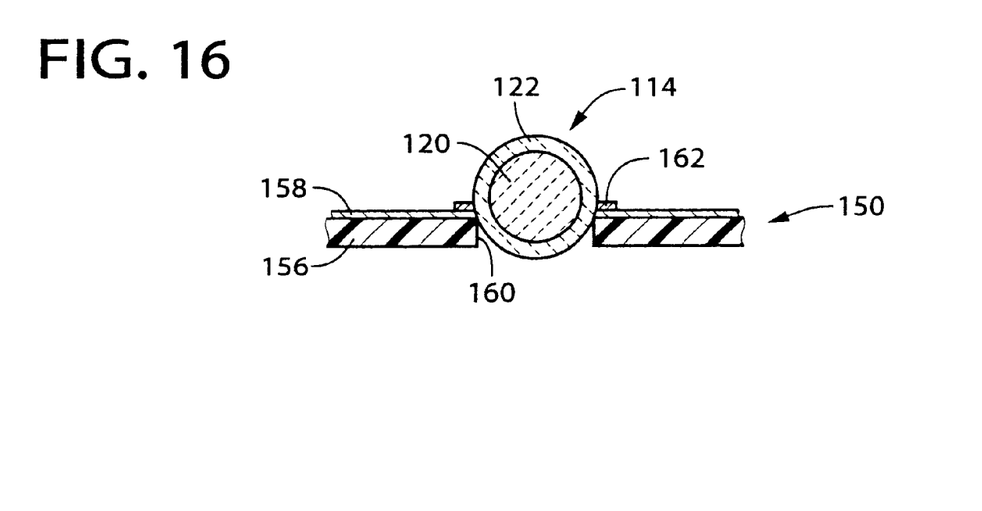
FIG. 16 is a view for explaining a hole-forming step and a fitting step of another photovoltaic-panel producing method as a third embodiment of the present invention.
Figure 17:
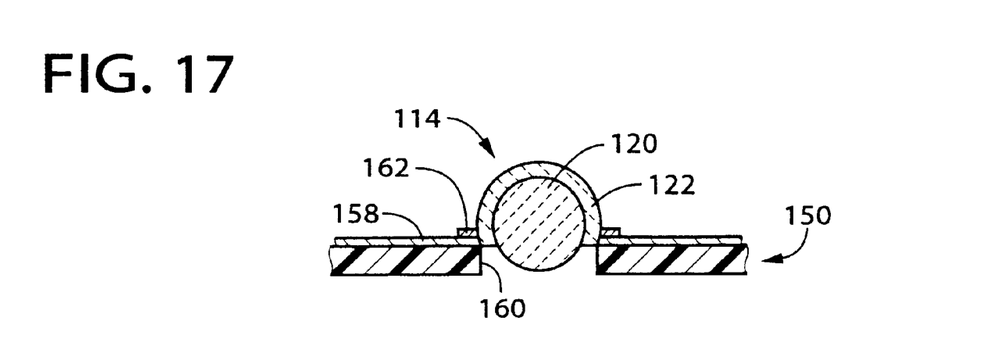
FIG. 17 is a view for explaining a removing step of the method of FIG. 16.
Figure 18:
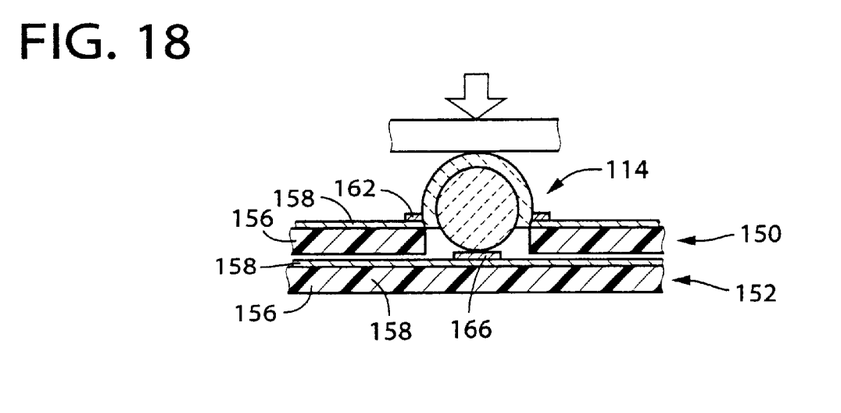
FIG. 18 is a view for explaining a first connecting step and a second connecting step of the method of FIG. 16.

At least one of a first and a second electrode plate may be provided by a printed wiring board. FIGS. 16, 17, and 18 shows another photovoltaic-panel producing method, as a third embodiment of the present invention, in which each of a first and a second electrode plate is provided by a printed wiring board 150, 152.

Each of the two printed wiring boards 150, 152 includes a synthetic-resin plate 156 as a plate-like insulating layer, and a conductive layer 158 which is provided by adhering a copper sheet to one of opposite major surfaces of the resin plate 156.

A connecting layer 162 is formed by printing a solder on respective portions of an outer surface of the conductive layer 158 of the printed wiring board 150 as the first electrode plate where a plurality of holes 160 are to be formed. Similarly, a connecting layer 166 is formed by printing a solder on respective portions of an outer surface of the conductive layer 158 of the printed wiring board 152 as the second electrode plate that are to face the respective cores 120 of the silicon balls 114. The respective patterns of the solders printed on the conducive layers 158 may be formed by subtractive method or additive method.

Figure 19:
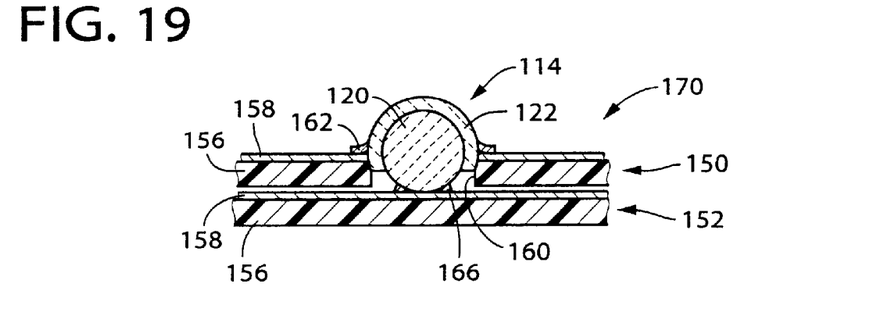
FIG. 19 is a partly cross-sectioned view of a photovoltaic panel produced according to the method including the steps of FIGS. 16 to 18.

The following steps employed in the third embodiment are basically the same as those employed in the second embodiment, and finally a photovoltaic panel 170, shown in FIG. 19, is obtained. However, in the third embodiment, as shown in FIG. 18, a pressing force is applied to the silicon balls 114, while the balls 114 are heated. Therefore, the silicon balls 114 are connected to the conductive layers 158 via the connecting layers 158 formed of the conductive materials (i.e., the solders). More specifically described, the shell portion 122 and the core portion 120 of each silicon ball 114 are electrically connected to the two conductive layers 158, respectively, via the respective connecting layers 162, 166.

In the third embodiment, too, the pressing force just helps electrically connect the silicon balls 114 to the conductive layers 15. Therefore, since the pressing force may be small. In addition, it is not needed to forcibly press the silicon balls 114 into the holes 160, the pressing force employed in the third embodiment may be smaller than that employed in the first or second embodiment.

Since in the third embodiment the printed wiring boards 150, 152 are employed as the electrode plates, the respective conductive layers 158 which have already been formed on the boards 150, 152 can be used as the first and second conductive layers.

However, it is not essentially needed to form the connecting layers 162, 166. In this case, the silicon balls 114 may be electrically connected, by pressing only, to the conductive layers 158. Since in this case no polishing step is needed to polish an insulating layer, a photovoltaic panel can be produced at a lower cost than the conventional producing method.

In the third embodiment, no space is provided between the two printed wiring boards 150, 152. Since no space is provided, the photovoltaic panel 170 enjoys an improved strength.

Figure 20:
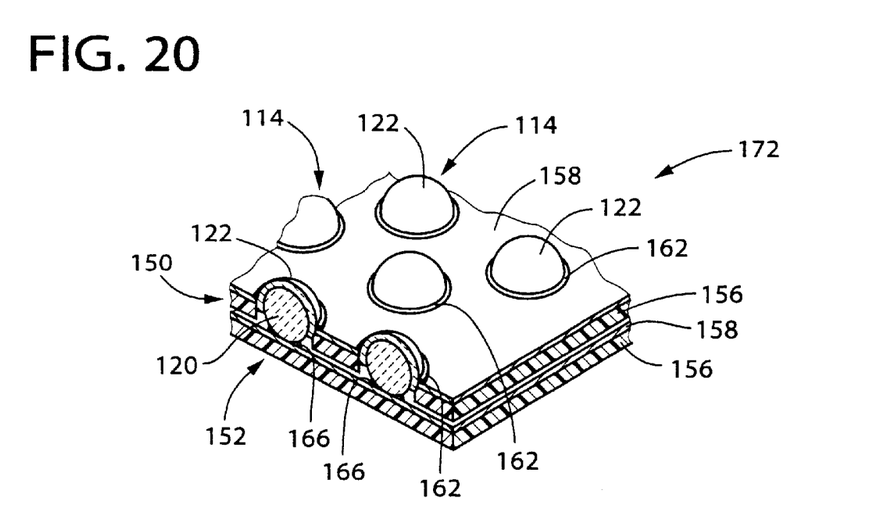
FIG. 20 is a perspective view of a photovoltaic panel produced according to another photovoltaic-panel producing method as a fourth embodiment of the present invention.

However, it is not essentially required that no space be provided between the two printed wiring boards 150, 152 which are superposed on each other. For example, it is possible to provide a space between the insulating layer 156 of the board 150 and the conductive layer 158 of the board 152. In the last case, a hot air may be flowed through that space to heat the connecting material or layer 166. FIG. 20 shows a photovoltaic panel 172 which is produced in this manner.

Each of the first and second electrode plates 30, 44, 110, 130, 150, 152 may be formed from a material other than those specified in the foregoing description. Each insulating layer may be formed from a ceramic material such as glass, and each conductive layer may be formed from a low-resistant metallic material such as an aluminum alloy.

It is to be understood that the present invention may be embodied with various other changes, modifications and improvements, such as those described in SUMMARY OF THE INVENTION, which may occur to a person skilled in the art, without departing from the spirit and scope of the invention defined in the appended claims.

What is claimed is:

1. A method of producing a photovoltaic panel, comprising the steps of:

forming a plurality of holes through a thickness of a first electrode plate including an electrically insulating layer and an electrically conductive layer which are superposed on each other, fitting, in said plurality of holes, a plurality of photovoltaic elements, respectively, each of which has a P-N junction between a core portion thereof and a shell portion thereof, removing a first portion of the shell portion of said each photovoltaic element that is located on the side of the insulating layer of the first electrode plate, so that a second portion of the core portion of said each photovoltaic element that corresponds to said first portion of the shell portion is exposed, electrically connecting a third portion of the shell portion of said each photovoltaic element to the conductive layer of the first electrode plate, and electrically connecting an end portion of said exposed, second portion of the core portion of said each photovoltaic element, to a second electrode plate, such that each of the holes formed through the thickness of the first electrode plate provides an annular vacant space which surrounds an annular remaining portion of said exposed second portion of the core portion, and accordingly said annular remaining portion of said exposed second portion of the core portion does not directly contact the electrically insulating layer of the first electrode plate.

2. A method according to claim 1, wherein an air is present in said annular vacant space.

3. A photovoltaic panel comprising:

a first electrode plate including a first electrically conductive layer and a first solder layer provided on the first conductive layer, and having a plurality of holes in the first conductive layer and the first solder layer;

a plurality of photovoltaic elements each of which has a P-N junction between a core portion thereof and a shell portion thereof covering a first portion of the core portion, and which are fitted in said plurality of holes, respectively, such that the shell portion of each of the photovoltaic elements is electrically connected to the first solder layer of the first electrode plate; and a second electrode plate including a second solder layer which is electrically connected to a second portion of the core portion of said each photovoltaic element that is opposite to the shell portion thereof and is not covered by the shell portion; and a first and a second protective layer each of which is formed of a material different from solder and which are provided on the first and second solder layers, respectively, to protect the first and second solder layers, respectively.

4. A photovoltaic panel according to claim 3, wherein said each photovoltaic element is formed from a silicon-based material and additionally includes a to-be-soldered layer which is formed from a material having a capability to be connected to both the solder and the silicon-based material, so that the to-be-soldered layer covers at least one of the shell portion and said second portion of the core portion, and at least one of the shell portion and said second portion of the core portion is electrically connected via the to-be-soldered layer to a corresponding one of the first electrode plate and the second electrode plate.

5. A photovoltaic panel according to claim 4, wherein said material from which the to-be-soldered layer is formed comprises at least one of nickel, nickel alloys, titanium, copper, cobalt, palladium, gold and silver.

6. A photovoltaic panel according to claim 3, further comprising an annular electrical insulator which covers an annular portion of the core portion of said each photovoltaic element that is located between said first and second portions thereof.

7. A photovoltaic panel according to claim 3, wherein the first electrode plate comprises, in addition to the first electrically conductive layer and the first solder layer, an electrically insulating substrate which covers the first conductive layer.

8. A photovoltaic panel according to claim 3, wherein the first and second protective layers are provided on respective outer surfaces of the first and second solder layers, the outer surface of the first solder layer being remoter from the outer surface of the second solder layer than from an inner surface of the second solder layer, the outer surface of the second solder layer being remoter from the outer surface of the first solder layer than from an inner surface of the first solder layer, and wherein the first conductive layer is provided on the inner surface of the first solder layer.

9. A photovoltaic panel according to claim 8, wherein the first protective layer is formed of a light-transmitting material.

10. A photovoltaic panel according to claim 8, wherein the first protective layer is formed of a transparent material.

11. A photovoltaic panel according to claim 8, wherein the first protective layer is formed of a material selected from the group consisting of resin and ceramics.

12. A photovoltaic panel according to claim 3, wherein the second electrode plate further includes a second electrically conductive layer provided on the outer surface of the second solder layer, and wherein the second protective layer comprises the second conductive layer.

13. A photovoltaic panel according to claim 3, wherein a vacant space is present between the first electrode plate and the second electrode plate.

14. A photovoltaic panel comprising:

a first electrode plate including an electrically insulating layer and a first electrically conductive layer which are superposed on each other, the first electrode plate having a plurality of holes formed through a thickness thereof;

a plurality of photovoltaic elements each of which has a P-N junction between a core portion thereof and a shell portion thereof covering at least a first portion of the core portion that is located on the side of the first conductive layer of the first electrode plate, and which are fitted in said plurality of holes, respectively, such that the shell portion of each of the photovoltaic elements is electrically connected to the first electrode plate; and a second electrode plate including a second electrically conductive layer which is electrically connected to a second portion of the core portion of said each photovoltaic element that is located on the side of the insulating layer of the first electrode plate and is not covered by the shell portion, such that each of the holes formed through the thickness of the first electrode plate provides an annular vacant space which surrounds an annular portion of the core portion that is located between the first and second portions thereof, and accordingly the annular portion of the core portion does not directly contact the electrically insulating layer of the first electrode plate.

15. A panel according to claim 14, wherein an air is present in the annular vacant space.

* * * * *